METHOD OF SHAPING P-N JUNCTION PROFILES

Filed March 31, 1965 2 Sheets-Sheet 1

INVENTORS
VIR A. DHAKA
EDWARD S WAJDA
BY [signature]
ATTORNEY

United States Patent Office 3,355,334
Patented Nov. 28, 1967

3,355,334
METHOD OF SHAPING P-N JUNCTION PROFILES

Vir A. Dhaka and Edward S. Wajda, Poughkeepsie, N.Y., assignors to International Business Machines Corporation, Armonk, N.Y., a corporation of New York Filed Mar. 31, 1965, Ser. No. 444,330
8 Claims. (Cl. 148—186)

ABSTRACT OF THE DISCLOSURE

This disclosure relates to controlling the distribution of impurities within a semiconductor material. By selecting a temperature in the range of several hundred degrees centigrade to the melting point of the semiconductor material that is used, the P- and N-type impurities in the semiconductor material are redistributed upon the application of a direct electric current through the semiconductor material.

This invention relates to an improved method for controlling the formation of a p-n junction in a semiconductor device and more specifically to a method for controlling the distribution of dopants or impurities within such a semiconductor material to control the formation of such junction.

In semiconductor devices such as diodes and transistors, the required potential gradients are produced across p-n junctions, that is to say, junctions between a semiconductor material characterized by a positive conductivity wherein conduction is primarily by the movement of "holes" and a semiconductor material of a negative conductivity wherein conduction is primarily by the flow of electrons. The type of conductivity characterizing a particular semiconductor material will depend upon the particular dopants or impurities distributed throughout that material. In general, diffusion of elements selected from Group III of the periodic table into the semiconductor material will result in p-type conductivity while diffusion of elements selected from Group V of the periodic table into a semiconductor material will normally result in n-type conductivity.

In forming a p-n junction in a single crystal of a semiconductor material such as germanium or silicon, the resultant junction will not be infinitely thin and the width of the transition region from one type of conductivity to the other affects the electrical characteristics of the device. For example, it is desirable to have a fairly wide transition zone, relatively speaking, to provide a gradual change in electrical charge distribution across the junction when it is desired to have a low junction capacitance. On the other hand, when it is desired to have relatively high junction capacitances as for example, in high frequency response devices, the width of the junction should be minimized. Also, it is desirable in the fabrication of a p-n-p or n-p-n transistor to form the base region therein of an extremely small thickness. In prior art devices, the reduction of this thickness was limited to a certain extent by the resolution of the mask technology employed in the diffusion process and it is desirable to be able to shift p-n junctions defining the base region to further reduce the base dimensions. It is, then, of importance to be able to controllably vary the profile or impurity distribution of a p-n junction.

The effect of an electric field upon the diffusion and distribution of impurity atoms has been studied quite thoroughly in the past. For example, purification of a semiconductor material has been achieved by electrolysis of a liquid melt of such material whereby donor type impurities will migrate toward the cathode and acceptor type impurities will migrate toward the anode. Furthermore, the electric field associated with a p-n junction has been observed to have an effect on that junction as it is formed by the diffusion of various dopants or impurities as mentioned above. For example, the solubility of added donor impurities which are capable of diffusing readily, tends to be higher on the p-type side than on the n-type side and the electric field associated with the junction acts to increase diffusion of the donor from the n-type side to the p-type side and to impede diffusion in the opposite direction. Therefore, creation of heavily doped surfaces may be employed to create electric fields within the semiconductor body for purposes of passivation and the like.

Still other methods of effecting diffusion or migration of impurities in a semiconductor material include the employment of temperature gradients to control diffusion rates. However, the establishment of such temperature gradients becomes impractical when the semiconductor element is of extremely small size. Furthermore, the employment of particular dopants or impurities to effect the solubility of other types of dopants is controllable in extremely small semiconductor devices only to a limited extent which is dependent upon such factors as the resolution of the diffusion masks employed. Finally, heating of a semiconductor material above its melting point to accommodate electromigration destroys the structure of the semiconductor device.

It is an object of the present invention to provide an improved method of forming a semiconductor device.

It is a further object of the present invention to provide an improved method of controlling the electric characteristics of a p-n junction in a semiconductor device.

It is another object of the present invention to provide an improved method of controllably varying the width of the transition region of a p-n junction in a semiconductor device.

It is still another object of the present invention to provide an improved method of minimizing the width of the transition region of a p-n junction in a semiconductor device.

It is still another object of the present invention to provide an improved method of shifting the transition region of a p-n junction in a semiconductor device.

When an electric field is applied across the p-n junction and a direct current is caused to flow therethrough for a sufficient period of time, the donor impurities of the n-region tend to migrate at a different rate than do the acceptor impurities in the p-region. It has been discovered that by controlling the current through the junction and also the temperature of the semiconductor device, the rates and direction of migration of the different impurities can be suitably controlled to achieve the desired junction profile.

A feature, then, of the present invention resides in the step of passing a direct current of a particular magnitude through a p-n junction for a preselected period of time to effect the diffusion or electromigration of the respective donor and acceptor impurities and achieve an increase or decrease in the width of the transition region as desired. A secondary feature of the present invention resides in a method of controlling both the current passed through the junction as well as the time duration thereof and the temperature at which the semiconductor device resides to achieve the desired impurity distribution across the transition region of the junction.

These and other objects, advantages and features of the present invention will become more readily apparent from a review of the following specification when taken in conjunction with the drawings wherein:

FIGURE 1 is an elevational view of apparatus for carrying out the method of the present invention;

FIGURE 2*a* is a set of curves illustrating the impurity distribution across a p-n junction both before and after electromigration in the manner contemplated in the present invention for a situation in which the transition region of the junction is varied in width;

FIGURE 2*b* is a set of curves similar to FIGURE 2*a* with the exception that the transition region has been caused to shift rather than vary in width;

At a particular temperature and under a particular electrical field, the diffusion of impurities in a solid is governed by the equation $$D\frac{\partial^2 c}{\partial \chi^2}-\mu E\frac{\partial c}{\partial \chi}=\frac{\partial c}{\partial t}$$

where E is the magnitude of the field strength, $c$ is the impurity concentration, $\chi$ is the direction of diffusion, $t$ is time, D is the diffusion constant and $\mu$ is the effective mobility. The last two constants have values dependent upon the particular type of impurities and the particular crystalline material through which diffusion takes place. The values of the diffusion constant can normally be found for particular materials in various handbooks. The mobility, $\mu$, is defined as the ratio of the average velocity of a particle and the electric field intensity and is given by the Einstein relation as $$\mu=\frac{Dq}{kT}$$

where $q$ is the charge of the ion, T is the absolute temperature and $k$ is the Boltzmann constant. It is seen that the mobility is quite temperature dependent. It is because of this temperature dependence, and other characteristics of the mobility that will be more thoroughly described below, that the choice of particular temperatures at which electromigration takes place can be utilized to control the profile of the transition region across a p-n junction.

Figure 1:
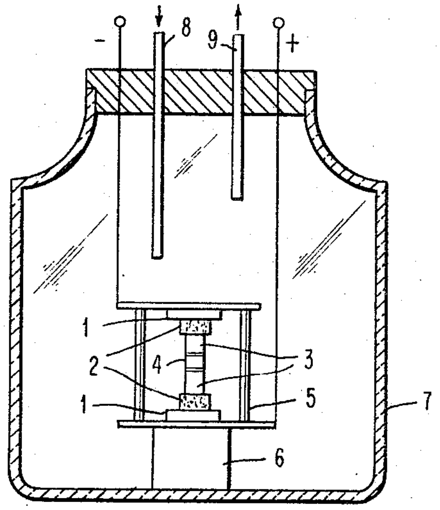

Since the manner in which the method of the present invention results in the desired junction profile shaping depends upon the characteristics of particular impurities in semiconductor materials, measurements of the effective mobility $\mu$ for various temperatures will first be described. The various values listed in the tables below were obtained by providing two samples of a particular crystalline material such as silicon or germanium with impurities deposited on polished faces which were then pressed against one another and inserted in apparatus such as illustrated schematically in FIGURE 1. The purpose of this apparatus is to both heat the samples and pass a direct electric current therethrough as well as to maintain an inert atmosphere about the samples. This apparatus is particularly advantageous in that the current passed through the samples to enable the electromigration can also be employed to heat the specimens. This current flow is between the respective positive and negative voltage sources through electrodes 1, spacers 2 and test samples 3 which acquire diffused impurity areas 4 because of the resultant electromigration. To provide an inert atmosphere about the samples, a gas such as nitrogen is supplied as by conduit 8 to chamber 7 in which the assembly is mounted and withdrawn through conduit 9. The assembly may be supported in chamber 7 by conventional insulators 5 and 6. Electrodes 1 are preferably of molybdenum and spacers 2 are preferably of graphite. The temperature of the specimens was measured by using a calibrated pyrometer.

After the electromigration has taken place, the effective mobility was calculated according to the equation $$\mu=\frac{xj+-xj-}{2Et}$$

where $\chi_{j+}$ and $\chi_{j-}$ are the measured depths into the respective samples to which the impurities were diffused with enhancement by the electric field and retardation by the electric field respectively. The respective depths may be measured by a probing method whereby a potential difference or resistivity is measured along the surface and compared to calibrations of a uniform material. Other measurement methods may be employed such as the distribution of radioactive isotopes among the diffused impurities or conventional staining techniques with visual observations. This formula for the effective mobility, $\mu$, is obtained from a solution of the above described equation of diffusion in the presence of an electric field where particular boundary conditions are prescribed.

TABLE I.—CALCULATION OF EFFECTIVE MOBILITY OF BORON IN SILICON UNDER AN APPLIED ELECTRIC FIELD

[Current density of 800 amps./cm.$^2$]

| Temp. (° C.) | Duration of Experiment $t$ (hrs.) | $\mu_{eff}$ (cm.$^2$/volt-sec.) |
|---|---|---|
| 880 | 89½ | $8.7\times10^{-11}$ |
| 1,200 | 6 | $7.32\times10^{-10}$ |
| 1,210 | 7½ | $8.9\times10^{-10}$ |
| 1,230 | 5 | $1.08\times10^{-9}$ |
| 1,240 | 6 | $1.35\times10^{-9}$ |
| 1,250 | 7½ | $2.12\times10^{-9}$ |

TABLE II.—CALCULATION OF EFFECTIVE MOBILITY OF ALUMINUM IN SILICON UNDER AN APPLIED ELECTRIC FIELD

[Current Density of 800 Amps./cm.$^2$]

| Temp. (° C.) | Duration of Experiment $t$ | | $\mu_{eff}$ (cm.$^2$/volt-sec.) |
|---|---|---|---|
| | *Hrs.* | *Min.* | |
| 1,073 | 3 | 55 | $1.01\times10^{-8}$ |
| 1,180 | 3 | 00 | $1.98\times10^{-8}$ |
| 1,210 | 4 | 00 | $4.9\times10^{-8}$ |
| 1,230 | 2 | 00 | $2.3\times10^{-7}$ |
| 1,240 | 0 | 30 | $1.1\times10^{-6}$ |

TABLE III.—CALCULATION OF EFFECTIVE MOBILITY OF PHOSPHORUS IN SILICON UNDER AN APPLIED ELECTRIC FIELD

[Current Density of 800 Amps./cm.$^2$]

| Temp. (° C.) | Duration of Experiment $t$ (hrs.) | Effective Mobility $\mu_{eff}$ (cm.$^2$/volt-sec.) | Direction of Motion |
|---|---|---|---|
| 850 | 96 | $2.53\times10^{-11}$ | Cathode. |
| 925 | 48 | $1.16\times10^{-10}$ | Do. |
| 1,190 | 5 | $7.36\times10^{-10}$ | Anode. |
| 1,300 | 6 | $2.83\times10^{-9}$ | Do. |
| 1,315 | 3 | $1.06\times10^{-8}$ | Do. |
| 1,325 | 5¾ | $1.65\times10^{-8}$ | Do. |
| 1,360 | 6 | $3.3\times10^{-8}$ | Do. |
| 1,390 | 2¼ | $1.35\times10^{-6}$ | Do. |

Different mechanisms which affect the electromigration include the state of ionization of the interstitial impurity, the effect of the electrical character of the substitional impurity during the diffusion process, electron entrainment and hole entrainment. These various mechanisms determine both the direction and magnitude of electromigration and will be discussed in relation to the various data given above. While other phenomena undoubtedly occur during electromigration, the above mentioned mechanisms are probably the more important.

Electron and hole entrainment result when the energy acquired by an electron or the effective energy acquired by a hole in the presence of an electric field is greater than the energy given to the heavier ions in that field such that the net result of collisions between the respective mobile carriers and the ionized impurity atoms is a transfer of a certain amount of momentum from the mobile carriers to the ions in the direction of momentum of the mobile carriers. Since electrons are accelerated toward the anode, the positive impurity ion will also move in that direction when electron entrainment occurs. Similarly, since holes or vacancies in an otherwise filled conduction band can be assigned positive charge values and positive mass values, the direction of average momentum of negative impurity ions will be toward the cathode when hole entrainment occurs as described above.

Figure 3:
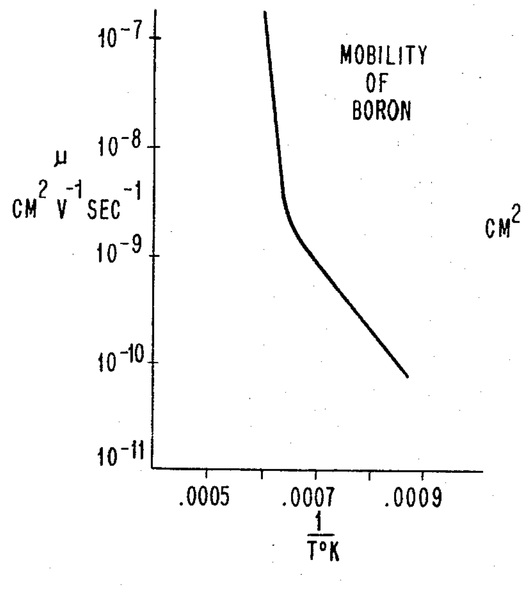
FIGURE 3 is a plot of the mobility of boron impurities in silicon versus the reciprocal of absolute temperature.

Interstitial and substitial boron at the temperatures measured as disclosed in Table I are positive ions experiencing a force toward the cathode. The measured values of mobility as indicated in Table I indicate that, at the temperatures involved, boron always moves toward the cathode and no reversal of the direction of electromigration is observed. A plot of mobility values for boron as a function of the reciprocal of absolute temperature are illustrated in FIGURE 3 and indicates a sharp change in the slope of such a plot at higher temperatures. It thus appears that at lower temperatures, electrostatic forces predominate while at higher temperatures, hole entrainment becomes significant.

Figure 4:
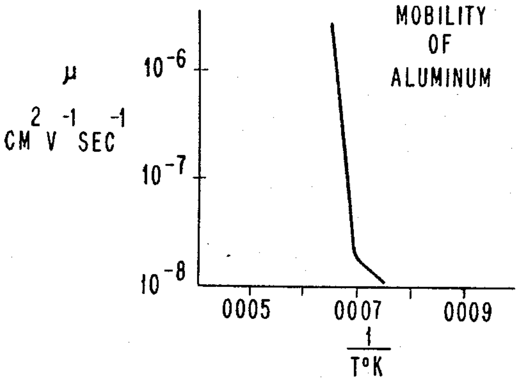
FIGURE 4 is a plot of the mobility of aluminum in silicon versus absolute temperature.

Table II above indicates that the behavior of aluminum in silicon is similar to that of boron in silicon. The electromigration effect, is however, much stronger and the effective mobility values are higher. A plot of these values is illustrated in FIGURE 4.

Figure 5:
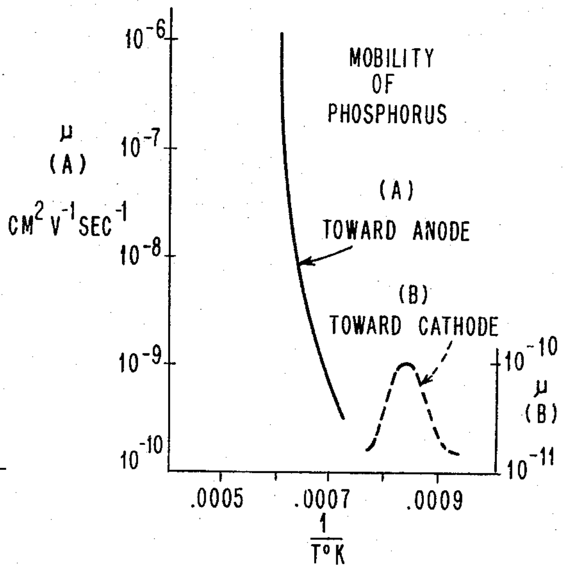
FIGURE 5 is a plot of the mobility of phosphorus in silicon versus absolute temperature.

The electromigration of phosphorus in silicon as indicated by the values given in Table III above indicate that phosphorus moves toward the cathode at values between 850 and 1190° C . while at temperatures above 1190° C., the direction of motion is reversed and toward the anode. A plot of these values is illustrated in FIGURE 5. It appears, then, that at lower temperatures, electrostatic forces predominate and at higher temperatures, electron entrainment becomes the dominant factor.

Furthermore, studies of the diffusion of antimony (Sb) in silicon indicates that antimony behaves in a manner similar to that of phosphorus. Similar measurements of the diffusion of antimony and indium (In) in germanium indicate that in those situations reversal of the direction of mobility occurs at temperatures about 600° C. where indium is a p-type impurity and antimony is an n-type impurity. The lower temperature values at which such a phenomenon occurs in germanium is to be expected since the melting point of germanium is only 958° C. while the melting point of silicon is 1420° C.

The above indicated temperature dependence of the direction of mobility is utilized in the method of the present invention to not only effect a change in the impurity distribution and the transition region of the p-n junction but may also be employed in the method of forming such a junction. For example, a semiconductor material such as silicon having both boron and phosphorus impurities distributed therein can be subjected to electromigration by passing a current perpendicular to the plane in which the junction is desired to be formed with the material being raised to a preselected temperature at which the boron will diffuse toward the cathode and the phosphorus will diffuse toward the anode. From the values given in the above tables, it is seen that this phenomenon will occur at temperatures above 1190° C. The only other consideration that need be made is that the current value and the length of time during which the current flows is to be sufficient to allow for sufficient diffusion of the respective impurities to the extent that the p-n junction becomes distinct.

More specifically, the method of the present invention may be employed to adjust the impurity distribution about such a p-n junction. For example, if the junction is formed in a material such as silicon where the n-side of the junction is formed with phosphorus and the p-side of the junction is formed with boron, a widening of the transition region across the junction may be achieved by heating the p-n junction device to a temperature above 1190° C. and passing a current through the semiconductor normal to the junction with the p-side of the junction being connected to the cathode and the n-side of the junction being connected to the anode. On the other hand, if it is desired to narrow the transition region across the junction, the direct current is passed through the semiconductor device with the respective biases reversed although the same temperature and current values are maintained.

Figure 2A:
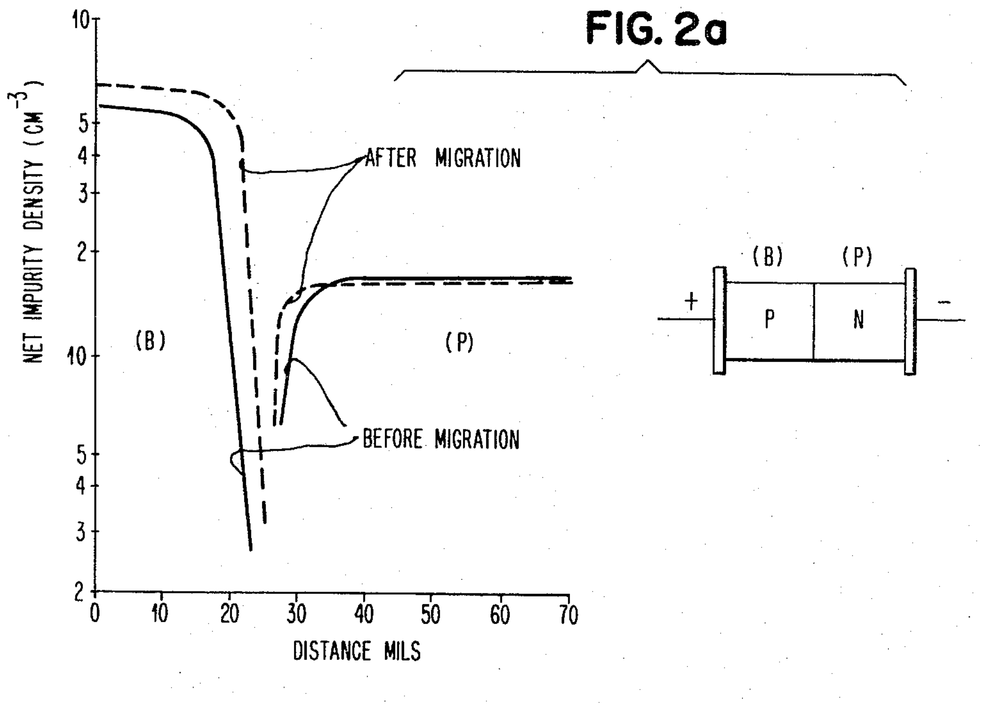

To illustrate this effect, reference is made to FIGURE 2*a* which illustrates the impurity distribution of boron and phosphorus in silicon as it would appear both before and after electromigration. The p-n junction device has dimensions of approximately 100 mils on the side and is placed in apparatus such as that illustrated in FIGURE 1 and a current passed therethrough. For the curves in FIGURE 2*a*, the p-side of the junction is connected to the anode and the n-side of the junction is connected to a cathode, the temperature of the environment is maintained at approximately 1200° C. and a current of approximately 25 amps is passed through the device for a period of approximately four hours. As a result of the electromigration the boron impurity distribution is shifted toward the cathode and the phosphorus impurity distribution is shifted toward the anode with a narrowing of the transition region as indicated in FIGURE 2*a*. When the electric bias is reversed, the respective migrations are in opposite directions resulting in a widening of the transition region.

Figure 2B:
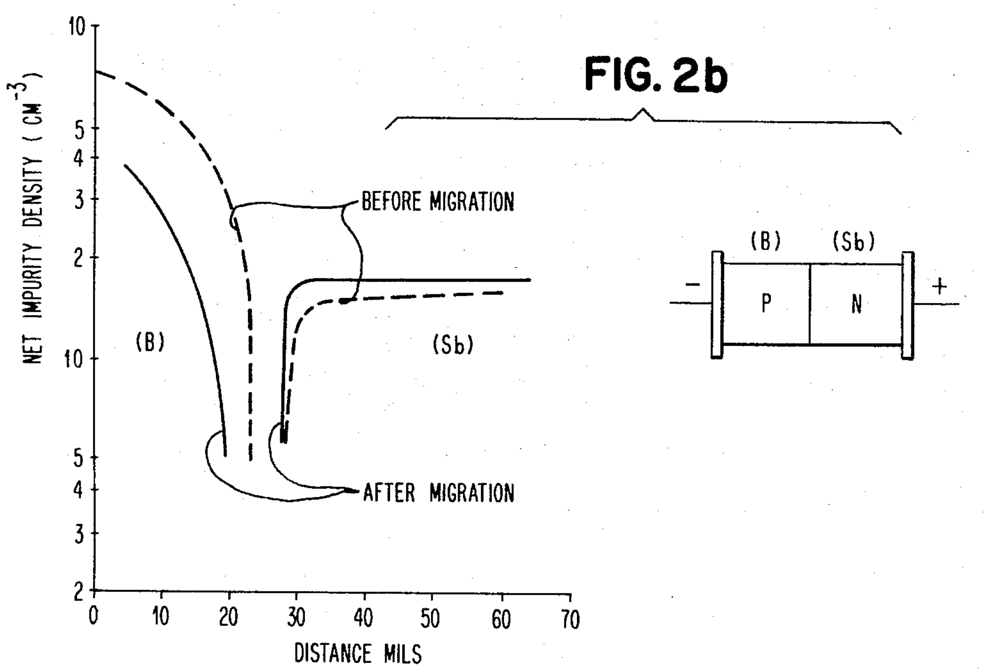

FIGURE 2*b* illustrates the change in impurity distributions for a p-n junction where boron is the p-type impurity and antimony is the n-type impurity. The temperature and current are the same as in the case of FIGURE 2*a*. However, the bias is reversed in relation to that shown in FIGURE 2*a*. The resulting migration was in the direction of the cathode for both impurites with a shift of the transition region. Since the mobility of boron is greater than that of antimony, there is also a resultant widening of the transition region. This may be reduced by a proper choice of a different temperature at which the electromigration is to take place.

With employment of the methods of the present invention, one may shift the position of a p-n junction, widen or narrow the transition region of the junction and even form such a junction. The shaping or reshaping of the impurity distributions is controlled by the proper choice of the temperature at which the electromigration takes place as well as the time duration thereof and the electric current employed. Whether the electromigration results in a junction shift or a change in the junction thickness depends on the value and direction of the mobilities of the respective impurities which mobilities are different functions of temperature for different impurities.

While the method of the present invention has been particularly illustrated and described with reference to preferred examples, it will be understood by those skilled in the art that changes and modifications in form and details may be made without departing from the spirit and scope of the present invention.

What is claimed is:

1. A method of altering the distribution of impurities selected from Group III and Group V of the periodic table in a semiconductor device whose material is selected from the class consisting of silicon and germanium which impurities are of both a p-conductivity type and an n-conductivity type and which impurities are each characterized by a temperature dependent mobility such that, above a particular temperature which lies in the range of several hundred degrees centigrade to the melting point of the semiconductor, the mobility directions of the respective different conductivity type impurities are opposite to one another, said method comprising the steps of:

raising the temperature of the device above said particular temperature; and passing a direct electric current through said device for a sufficient period of time to achieve a particular distribution of both the p-type and n-type impurities where the electromigration of the respective impurities is proportional to the time during which current is passed through said device.

2. A method according to claim 1 wherein the p-type impurities and the n-type impurities reside in different regions of said device so as to form a p-n junction having a transition region between the respective p and n regions and wherein the bias applied across the device is in such a direction that upon passage of current through said device, the respective p impurities and n impurities will be activated away from said junction to effectively widen said transistor region.

3. A method according to claim 1 wherein the p-type impurities and the n-type impurities reside in different regions of said device so as to form a p-n junction having a transition region between the respective p and n regions and wherein the bias applied across the device is in such a direction that upon passage of current through said device, the respective p impurities and n impurities will be activated toward said junction to effectively narrow said transition region.

4. A method according to claim 1 wherein the respective p and n type impurities are relatively evenly distributed throughout said semiconductor device and where the current is passed through said device for a sufficiently long period of time to segregate the respective p and n type impurities in separate regions of the device.

5. A method according to claim 1 wherein the p-type impurity is selected from the group of boron and aluminum and the n-type impurity is phosphorus, the impurities being dispersed in a silicon crystal and where the temperature of the device is maintained above approximately 1190° C. during the time the current is passed through said device.

6. A method of effecting the shift of a p-n junction within a semiconductor device whose material is selected from the class consisting of silicon and germanium having p-type and n-type impurities respectively selected from Group III and Group V of the periodic table each characterized by a temperature dependent mobility such that below a particular temperature value which lies in the range of several hundred degrees centigrade to the melting point of the semiconductor, the mobility directions of the respective different impurities are the same, said method comprising the steps of:

raising the temperature of the device to a value just below said particular temperature; and passing a direct electric current through said device for a sufficient period of time to allow electromigration of each of said impurities in a particular direction dependent on the direction of current flow where the electromigration of the respective impurities is proportional to the time during which current is passed through said device.

7. A method according to claim 6 wherein the p-type impurity is selected from the group of boron and aluminum and the n-type impurity is phosphorus, the impurities being dispersed in a silicon crystal, and wherein said particular temperature below which said device is maintained is 1190° C.

8. A method according to claim 7 wherein said device is raised to a temperature in the range between 850° C. and 1190° C.

References Cited

UNITED STATES PATENTS

| | | | |
|---|---|---|---|
| 2,697,269 | 12/1954 | Fuller | 148—186 X |
| 2,711,379 | 6/1955 | Rothstein. | |
| 2,916,408 | 12/1959 | Freedman | 148—183 |

HYLAND BIZOT, *Primary Examiner.*